United States Patent
Chen

(10) Patent No.: US 8,536,633 B2
(45) Date of Patent: Sep. 17, 2013

(54) METAL-OXIDE-SEMICONDUCTOR FIELD-EFFECT TRANSISTOR WITH ELECTROSTATIC-DISCHARGE PROTECTION AND VOLTAGE-STABILIZING CAPACITOR AND METHOD FOR MANUFACTURING THE SAME

(75) Inventor: Yi-Lin Chen, Taipei (TW)

(73) Assignee: Realtek Semiconductor Corp., Hsinchu (TW)

( * ) Notice: Subject to any disclaimer, the term of this patent is extended or adjusted under 35 U.S.C. 154(b) by 653 days.

(21) Appl. No.: 11/968,874

(22) Filed: Jan. 3, 2008

(65) Prior Publication Data

US 2008/0164505 A1 Jul. 10, 2008

(30) Foreign Application Priority Data

Jan. 5, 2007 (TW) ................................ 96100484 A

(51) Int. Cl.
*H01L 27/108* (2006.01)
(52) U.S. Cl.
USPC .................................. 257/296; 257/E29.345
(58) Field of Classification Search
USPC ................. 257/401, 402, 355, 356, 360, 532, 257/E27.034
See application file for complete search history.

(56) References Cited

U.S. PATENT DOCUMENTS

| | | | |
|---|---|---|---|
| 5,917,219 A * | 6/1999 | Nandakumar et al. | 257/348 |
| 6,285,052 B1 * | 9/2001 | Draper | 257/300 |
| 7,672,101 B2 * | 3/2010 | Lin et al. | 361/56 |
| 2001/0015449 A1 * | 8/2001 | Niguyen et al. | 257/296 |
| 2006/0065933 A1 * | 3/2006 | Chu et al. | 257/355 |
| 2006/0092592 A1 * | 5/2006 | Huang | 361/220 |
| 2006/0215337 A1 * | 9/2006 | Wu et al. | 361/56 |
| 2008/0164505 A1 * | 7/2008 | Chen | 257/296 |

OTHER PUBLICATIONS

English language translation of abstract of TW 483143.
English language translation of abstract of TW 522246.

* cited by examiner

*Primary Examiner* — Ha Tran T Nguyen
*Assistant Examiner* — Vongsavanh Sengdara
(74) *Attorney, Agent, or Firm* — McClure, Qualey & Rodack, LLP

(57) ABSTRACT

The present invention relates to a metal-oxide-semiconductor field-effect transistor (MOSFET) with electrostatic-discharge (ESD) protection and a voltage-stabilizing capacitor, and a method for manufacturing the same and is applied to a chip, including a P-type substrate, a conductor layer, a first N-type doping region, a second N-type doping region, and an N-type well. The conductor layer is coupled to the ground; the first N-type doping region is coupled to the power supply; the second N-type doping region is coupled to a VDD pad (power-supply pad). Thereby, when the chip is not installed or not operating, the MOSFET can be used for ESD protection. When the chip is operating, the conductor layer, the first N-type doping region, the second N-type doing region, and the N-type well form a gate capacitor as a voltage-stabilizing capacitor between the power supply and the ground. Hence, the objective of fully utilization is achieved. In addition, the chip size is saved and thus the cost thereof is reduced.

10 Claims, 2 Drawing Sheets

METAL-OXIDE-SEMICONDUCTOR FIELD-EFFECT TRANSISTOR WITH ELECTROSTATIC-DISCHARGE PROTECTION AND VOLTAGE-STABILIZING CAPACITOR AND METHOD FOR MANUFACTURING THE SAME

FIELD OF THE INVENTION

The present invention relates generally to a metal-oxide-semiconductor field-effect transistor, and more particularly to a metal-oxide-semiconductor field-effect transistor with electrostatic-discharge protection and a voltage-stabilizing capacitor, and a method for manufacturing the same.

BACKGROUND OF THE INVENTION

In recent years, the development of the electronic industry, particularly the semiconductor industry, advances rapidly. Thereby, the size of a chip is getting smaller with more functions. Accordingly, to utilize the devices in a chip effectively and to make them function within limited space are the objectives of the semiconductor industry. The electrostatic-discharge (ESD) protection devices used in a chip are generally realized by connecting the pad in a chip to a dummy metal-oxide-semiconductor field-effect transistor (MOSFET) for preventing damage caused by large currents generated by static charges entering the internal circuitry of the chip.

FIG. 1 shows a structural schematic diagram of a conventional N-type MOSFET (NMOSFET) for ESD protection. As shown in the figure, a P-type substrate 1' is provided and a gate oxide layer 2' is set up thereon. In addition, a polysilicon layer 3' is set up on the gate oxide layer 2' as a gate electrode, and is coupled to the ground. In the P-type substrate 1', a first N-type doping region 10' and a second N-type doping region 12' are set up on both sides of the gate oxide layer 2' for being a source electrode and a drain electrode. The first N-type doping region 10' is coupled to the ground, while the second N-type doping region 12' is coupled to a pad 4'. When the current produced by static charges enters the chip through the pad 4', it will be led to the ground by way of the PN junction formed by the second N-type doping region 12' and the P-type substrate 1' of the NMOSFET, and of the bipolar-transistor effect produced by the first N-type doping region 10', the P-type substrate 1', and the second N-type doping region 12'. Thereby, ESD protection is achieved.

The structure described above has superior effect on ESD protection. Nevertheless, when the chip operates, the MOSFET is not functioning, which is regrettable in terms of design of semiconductor chips. In general, if voltage-stabilizing effect is needed between the power supply and the ground, an extra capacitor is needed with the expense of extra chip space. Thereby, the size of the chip is increased, and hence the cost thereof is increased as well.

Accordingly, a novel MOSFET and a method for manufacturing the same are proposed for providing ESD protection as well as voltage-stabilizing effect between the power supply and the ground.

SUMMARY

The objective of the present invention is to use a gate capacitor between the power supply and the ground formed by a conductor layer, an N-type well, a first N-type doping region, and a second N-type doping region as a voltage-stabilizing capacitor for fully utilizing a chip.

Another objective of the present invention is to use the capacitor of a MOSFET as a voltage-stabilizing capacitor between the power supply and the ground without the need of manufacturing a capacitor by using extra chip space. Hence, the manufacturing cost is reduced.

In order to achieve the objectives and the advantages described above, the present invention uses a dummy MOSFET of a chip. Thereby, when the chip is not installed or operating, human-body model (HBM) ESD and machine model (MM) ESD can be avoided. On the other hand, if the chip is operating, the capacitor formed by a first N-type doping region, a second N-type doping region, an N-type well therebetween, and a conductor layer as a voltage-stabilizing capacitor between the power supply and the ground. Hence, the MOSFET is utilized effectively and the performance of the chip is enhances without the need of manufacturing the stabilizing capacitor using extra chip space. Consequently, chip size is saved, and thereby the cost thereof is reduced.

DETAILED DESCRIPTION

In order to make the structure, characteristics and effectiveness of the present invention to be further understood and recognized, the detailed description of the present invention is provided as follows along with preferred embodiments and accompanying figures.

In an NMOSFET for ESD protection according to the prior art, when static charges enter a chip through a pad, the current produced by the static charges will be led to the ground by way of the NMOSFET. However, when the chip is operating, the NMOSFET is shut off. Thereby, the present invention provides a MOSFET with electrostatic-discharge protection and a voltage-stabilizing capacitor. When the chip is not installed or not operating, the NMOSFET can be used for ESD protection. When the chip is operating normally, the NMOSFET can be used as a voltage-stabilizing capacitor between the power supply and the ground.

Figure 1:
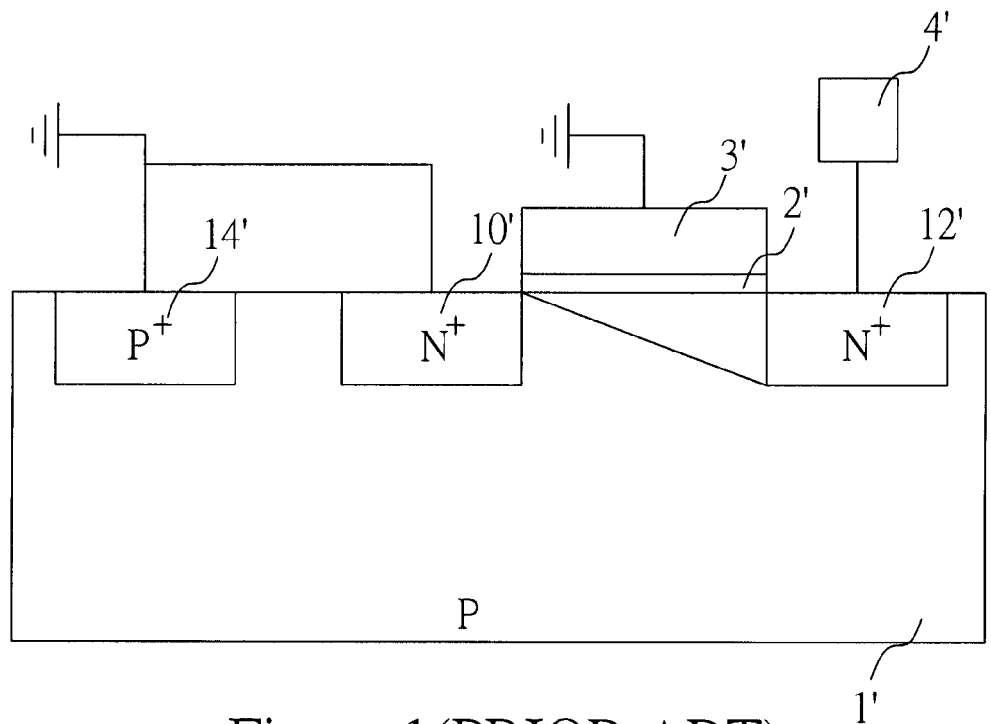
FIG. 1 shows a structural schematic diagram of an NMOSFET for ESD protection according to the prior art.
Figure 2:
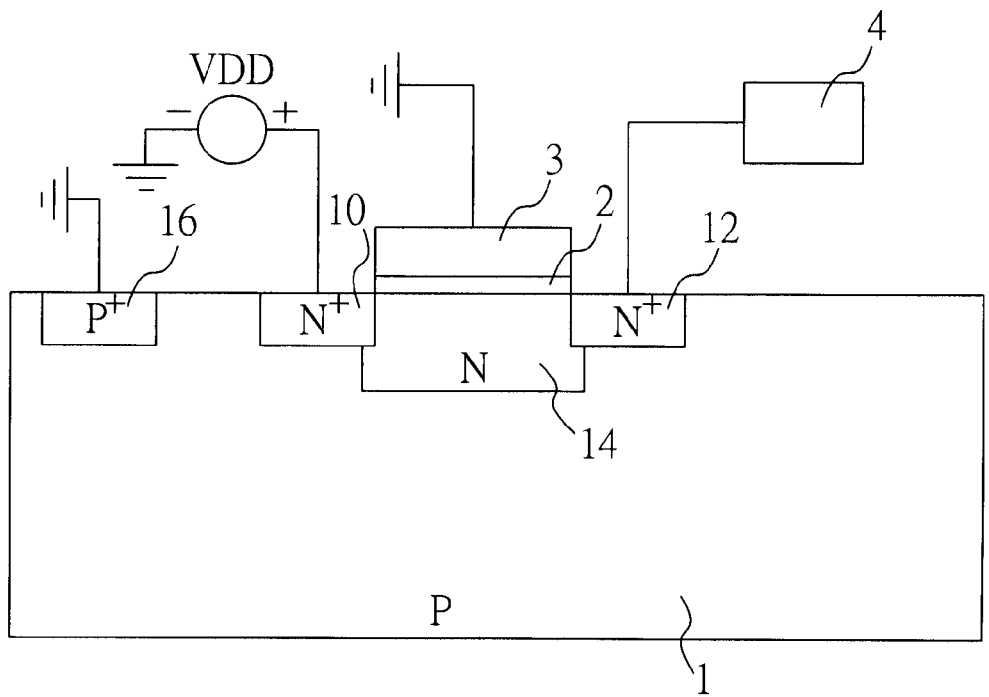
FIG. 2 shows a structural cross-sectional view of an NMOSFET according to a preferred embodiment of the present invention.

FIG. 2 shows a structural cross-sectional view of an NMOSFET illustrated according to a preferred embodiment of the present invention. As shown in the figure, the NMOSFET is used in a chip including a P-substrate 1, a first N-type doping region 10, a second doping region 12, an N-type well 14, a P-type doping region 16, a gate oxide layer 2, and a conductor layer 3. The gate oxide layer 2 is set up on the P-type substrate 1; the conductor layer 3 is set up on the gate oxide layer 2; and the material of the conductor layer 3 may include polysilicon. According to the present embodiment, ion implantation is used for forming the N-type well 14, the first N-type doping region 10, and the second N-type doping region 12 in the P-type substrate 1. Besides, the first N-type doping region 10 and the second N-type doping region 12 are located on both sides of the gate oxide layer 2. The N-type well 14 is located below the gate oxide layer 2, and covers boundaries of the first N-type doping region 10 and the second N-type doping region 12. The P-type doping region 16 is set up in the P-type substrate 1 for grounding the P-type substrate 1. The conductor layer 3 is used as a gate electrode, and is coupled to the ground. The first N-type doping region 10 is coupled to the power supply, while the second N-type doping region 12 is coupled to the VDD pad 4. When the current produced by static charges enter the VDD pad 4 (power-supply pad) through a pin of the chip, because of the PN junction formed by the second N-type doping region 12 and the P-type substrate 1, the current is led to the ground from the P-type doping region 16. Thus, electrostatic discharge is completed.

The conductor layer 3 is used as a gate electrode, and is coupled to the ground. The first N-type doping region 10 is coupled to the power supply, while the second N-type doping region 12 is coupled to the VDD pad 4. When the current produced by static charges enter the VDD pad 4 (power-supply pad) through a pin of the chip, because of the PN junction formed by the second N-type doping region 12 and the P-type substrate 1, the current is led to the ground from the P-type doping region 16. Thus, electrostatic discharge is completed.

When the chip operates normally, the N-type well 14, the first N-type doping region 10, the second N-type doping region 12, and the conductor layer 3 can form a capacitor. Then, the first and the second N-type doping regions 10, 12 are coupled to the power supply with the conductor layer 3 coupled to the ground to form a voltage-stabilizing capacitor between the power supply and the ground. Thereby, when the chip operates normally, the MOSFET can be fully utilized to act as a voltage-stabilizing capacitor.

Figure 3:
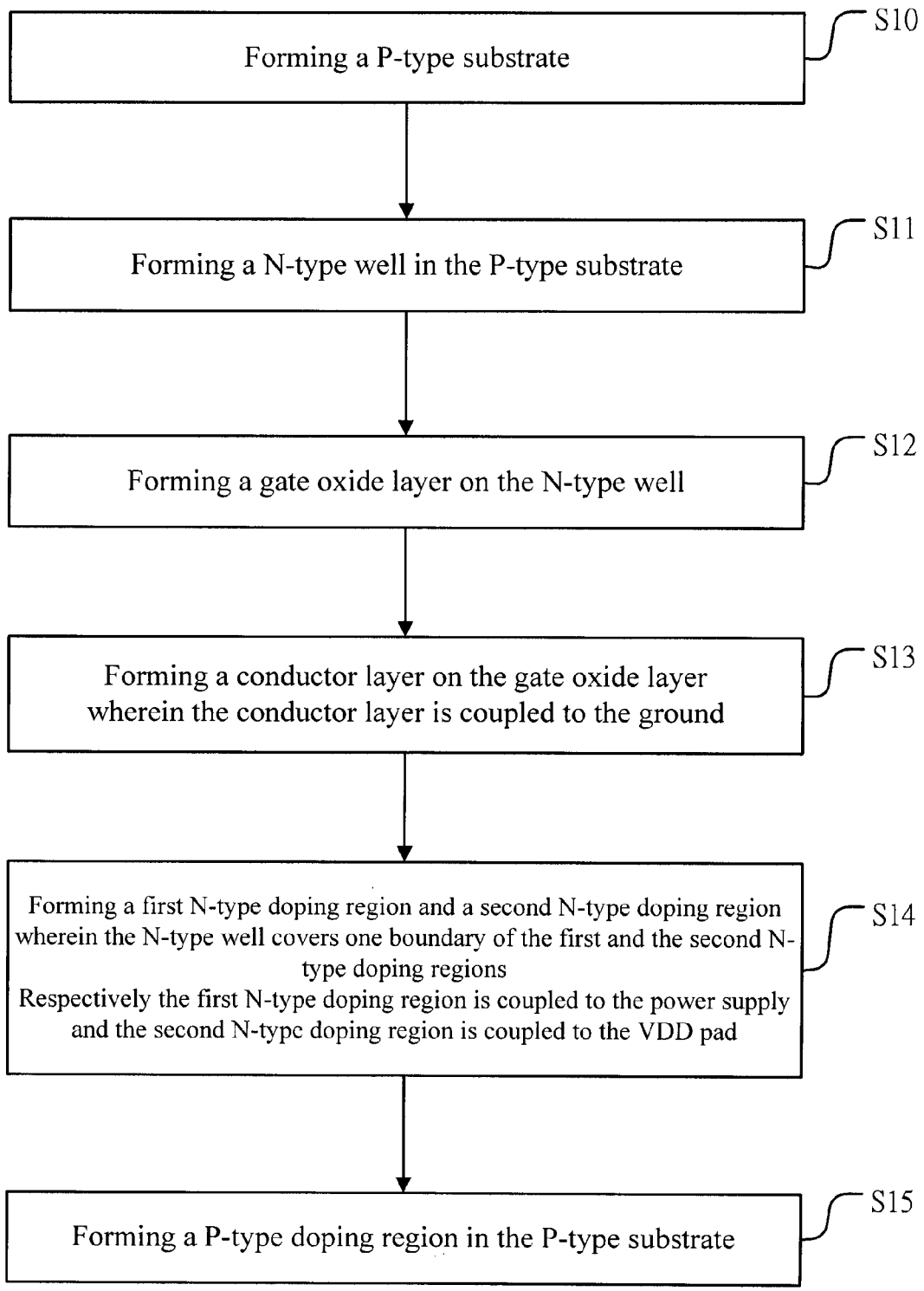
FIG. 3 shows a flowchart for manufacturing an NMOSFET according to a preferred embodiment of the present invention.

FIG. 3 shows a flowchart for manufacturing an NMOSFET according to a preferred embodiment of the present invention. As shown in the figure, the MOSFET is used in a chip. First, the step S10 is executed for forming a P-type substrate. Then, the step S11 is executed for forming an N-type well in the P-type substrate. Next, the step S12 is performed for forming a gate oxide layer on the N-type well. Afterwards, the step S13 is executed for forming a conductor layer on the gate oxide layer, wherein the conductor layer is coupled to the ground. In this step, the conductor layer is used as the gate electrode. Then, the step S14 is performed for forming a first N-type doping region and a second N-type doping region, wherein the first N-type doping region is coupled to the power supply, while the second N-type doping region is coupled to the VDD pad. In this step, ion implantation of N-type ions can be used to form the first and second N-type doping regions, and the N-type well in the P-type substrate. In addition, the first, the second N-type doping regions are formed on both sides of the gate oxide layer, and the N-type well covers one boundary of each of the first and the second N-type doping regions. Next, the step S15 is executed for forming a P-type doping region in the P-type substrate. The P-type doping region is used for grounding the P-type substrate.

When the chip is not installed in a circuit or not operating, it can be easily influenced by static charges. The current produced by the static charges will enter the VDD pad through a pin of the chip, and be led to the ground via the PN junction formed by the second N-type doping region and the P-type substrate.

Furthermore, when the chip operates normally, the conductor layer, the first N-type doping region, the second N-type doping region, and the N-type well can form a gate capacitor. Then, the first and the second N-type doping regions are coupled to the power supply with the conductor layer coupled to the ground for forming the voltage-stabilizing capacitor between the power supply and the ground.

To sum up, the aforementioned embodiments provide a metal-oxide-semiconductor field-effect transistor with electrostatic-discharge protection and features of a voltage-stabilizing capacitor, and a method for manufacturing the same. The PN junction formed by a second N-type doping region and a P-type substrate of a N-type MOSFET can lead static charges to the ground. In addition, when the chip operates, a conductor layer, an N-type well, a first N-type doping region, and the second N-type doping region form a capacitor as the voltage-stabilizing capacitor between the power supply and the ground. Thereby, the MOSFET is fully utilized, and thus manufacturing cost thereof is reduced.

Accordingly, the present invention conforms to the legal requirements owing to its novelty and non-obviousness. However, the foregoing description is only a preferred embodiment and should not be used to limit the scope and range of the present invention. Equivalent changes or modifications made according to the shape, structure, feature, and spirit described are included in the claims of the present invention.

The invention claimed is:

1. A metal-oxide-semiconductor field-effect (MOSFET) transistor, comprising:
   a P-type substrate;
   a gate oxide layer, located on the P-type substrate;
   a conductor layer, located on the gate oxide layer;
   a ground terminal connected to the conductor layer, and coupled to ground;
   a first N-type doping region, located in the P-type substrate and on one side of the gate oxide layer;
   a power terminal connected to the first N-type doping region, and coupled to a power supply;
   a second N-type doping region, located in the P-type substrate and on the other side of the gate oxide layer;
   a power-supply pad terminal connected to the second N-type doping region, and coupled to a power-supply pad; and
   an N-type well, located in the P-type substrate and between the first N-type doping region and the second N-type doping region, and covering one entire boundary of the first N-type doping region and of the second N-type doping region;
   a PN junction formed by the second N-type doping region and the P-type substrate for leading electrostatic-discharge current to the ground when the metal-oxide-semiconductor field-effect transistor is not operating, wherein the first and the second N-type doping regions forms a voltage-stabilizing capacitor between the power supply and the ground when the metal-oxide-semiconductor field-effect transistor is operating.

2. The MOSFET of claim 1, wherein a P-type doping region is formed on the P-type substrate, and the P-type doping region is coupled to the ground.

3. The MOSFET of claim 1, wherein the material of the conductor layer includes polysilicon.

4. The MOSFET of claim 1, and being implemented in a chip.

5. The MOSFET of claim 1, wherein the conductor layer can be used as a gate electrode.

6. A metal-oxide-semiconductor field-effect transistor (MOSFET) with electrostatic-discharge protection and a voltage-stabilizing capacitor, the MOSFET being implemented in a chip, comprising:
   a gate oxide layer formed on a P-type substrate;
   a conductor layer on the gate oxide layer;
   a ground terminal connected to the conductor layer and coupled to ground;
   a first N-type doping region, the first N-type doping region being located in the P-type substrate and on one side of the gate oxide layer;

a power terminal connected to the first N-type doping region and coupled to a power supply;

a second N-type doping region, the second N-type doping region being located in the P-type substrate and on the other side of the gate oxide layer;

a power-supply pad terminal connected to the second N-type doping region and coupled to a power-supply pad;

an N-type well formed in the P-type substrate and connected to the first and second N-type doping regions, the N-type well being located between the first and second N-type doping regions; and a PN junction formed by the second N-type doping region and the P-type substrate for leading electrostatic-discharge current to ground when the chip is not operating, wherein the conductor layer, the N-type well, the first N-type doping region and the second N-type doping region form the voltage-stabilizing capacitor between the power supply and ground when the chip is operating.

7. The MOSFET of claim 6, wherein the N-type well completely covers a boundary formed with each of the first and second N-type doping regions.

8. A metal-oxide-semiconductor field-effect transistor (MOSFET) with electrostatic-discharge protection and a voltage-stabilizing capacitor, comprising:

a gate oxide layer formed on a P-type substrate;

a conductor layer on the gate oxide layer;

a ground terminal connected to the conductor layer and coupled to ground;

a first N-type doping region, the first N-type doping region being located in the P-type substrate and on one side of the gate oxide layer;

a power terminal connected to the first N-type doping region and coupled to a power supply;

a second N-type doping region, the second N-type doping region being located in the P-type substrate and on the other side of the gate oxide layer;

a power-supply pad terminal connected to the second N-type doping region and coupled to a power-supply pad;

an N-type well formed in the P-type substrate and completely covering one boundary of each of the first and second N-type doping regions, the N-type well being located between the first and second N-type doping regions; and a PN junction formed by the second N-type doping region and the P-type substrate for leading electrostatic-discharge current to ground when the MOSFET is not operating, wherein the first and the second N-type doping regions forms the voltage-stabilizing capacitor between the power supply and ground when the MOSFET is operating.

9. The MOSFET of claim 8, wherein the P-type substrate comprises a P-type doping region for grounding the P-type substrate.

10. The MOSFET of claim 8, wherein the power supply coupled to the first N-type doping region is a positive power supply voltage relative to ground.

* * * * *